United States Patent [19]

Nishimura et al.

[11] Patent Number: 5,443,679
[45] Date of Patent: Aug. 22, 1995

[54] TAPE BONDING APPARATUS

[75] Inventors: Akihiro Nishimura; Koji Sato, both of Tokyo, Japan

[73] Assignee: Kabushiki Kaisha Shinkawa, Tokyo, Japan

[21] Appl. No.: 101,775

[22] Filed: Aug. 2, 1993

Related U.S. Application Data

[63] Continuation of Ser. No. 860,286, Mar. 4, 1992, abandoned, which is a continuation of Ser. No. 534,158, Jun. 6, 1990, abandoned.

[30] Foreign Application Priority Data

Jun. 7, 1989 [JP] Japan .................................. 1-143041

[51] Int. Cl.$^6$ ............................................. B32B 31/04
[52] U.S. Cl. .................................. 156/361; 156/495; 156/522; 156/552; 226/33; 226/45
[58] Field of Search ................ 156/361, 362, 363, 364, 156/494, 495, 522, 543, 552; 226/33, 45

[56] References Cited

U.S. PATENT DOCUMENTS

| | | | |
|---|---|---|---|
| 4,460,421 | 7/1984 | Booth et al. | 156/361 X |
| 4,505,772 | 3/1985 | Renz | 156/552 X |
| 4,571,354 | 2/1986 | Maxwell | 156/253 X |
| 4,582,421 | 4/1986 | Hamlin et al. | 156/567 X |
| 4,617,080 | 10/1986 | Kobayashi et al. | 156/359 |
| 4,661,192 | 4/1987 | McShane | 156/292 |
| 4,804,432 | 2/1989 | Jurrius et al. | 156/350 |
| 4,807,790 | 2/1989 | Ushioda et al. | 226/2 |
| 5,052,606 | 10/1991 | Cipolla et al. | 156/552 X |
| 5,223,063 | 6/1993 | Yamazaki et al. | 156/73.2 |

Primary Examiner—David A. Simmons
Assistant Examiner—J. Sells
Attorney, Agent, or Firm—Koda & Androlia

[57] ABSTRACT

A tab tape bonder including a bonding device which bonds semiconductor chips, etc. to a tab tape, a first roller driver which feeds the tab tape into the bonding device, a detector which detects holes or perforations formed in the tab tape fed by the first roller driver, and a controller which controls the feeding pitch of the tab tape by the first roller driver in accordance with the detection results obtained by the detector.

10 Claims, 3 Drawing Sheets

TAPE BONDING APPARATUS

This is a continuation of application Ser. No. 860,286, filed Mar. 4, 1992, abandoned, which is a continuation of application Ser. No. 534,158 filed Jun. 6, 1990 abandoned.

BACKGROUND OF THE INVENTION

1. Field of the Invention

The present invention relates to a tab tape bonding apparatus which is used to bond semiconductor chips or single bumps to a tab tape.

2. Prior Art

Conventional tab tape bonding devices related to the present invention are disclosed in, for example, Japanese Patent Application Laid-Open (Kokai) Nos. 57-12529 (hereafter called "Conventional Device 1"), 54-116875 ("Conventional Device 2"), and 63-166238 ("Conventional Device 3").

Conventional Devices 1 and 2 are each equipped with (a) a loading section having a supply reel on which the tab tape is wound, (b) an unloading section provided with a take-up reel that takes up the tab tape after the completion of bonding, (c) a bonding device installed between the loading section and the unloading section so as to bond semiconductor chips to the tab tape, and (d) a tape feeder which intermittently feeds the tab tape wound on the supply reel to the bonding device and then to the take-reel at a predetermined pitch. The tape feeder is a means for driving a sprocket wheel which feeds the tab tape by engaging the teeth of the sprocket wheels with perforations formed in the tab tape.

In Conventional Device 3, the unloading section is a magazine. Accordingly, in order to cut the tab tape into card-form pieces of fixed dimensions after bonding, a cutter is employed. The cutter cuts the tab tape between the sprocket wheel driving means and the magazine. In addition, Conventional Device 3 is equipped with a roller driving means which acts as a tape feeding means so as to feed the cut-out card form pieces of tab tape into the magazine.

Thus, in the prior art, the tab tape wound on the supply reel is fed at fixed intervals to the bonding position of the bonding device by the sprocket wheel driving means so as to bond semiconductor chips to the tab tape.

In Conventional Devices 1 and 2, the tab tape is fed by the sprocket wheel driving means after bonding and then taken up on the take-up reel. In Conventional Device 3, the tab tape fed by the sprocket wheel driving means after bonding is cut into card-form pieces by the cutter, and then these card-form tab tape pieces are fed by the roller driving means and stored in the magazine.

Since the tab tape is fed by sprocket wheel driving means, the following problem arises: It is necessary to replace the sprocket wheels so as to meet with different pitches and shapes of perforations of the tab tape and with different tab tape widths. In other words, several sprocket wheels are necessary to handle various types of tab tapes which may be used.

Furthermore, since the tab tape is forcibly fed via sprocket wheels, the perforations may be damaged by the teeth of the sprocket wheels. Furthermore, the position in which the tab tape stops may vary erratically as a result of looseness [rattling] between the teeth of the sprocket wheels and the perforations. Thus, the precision with which the tab tape can be positioned tends to be poor.

SUMMARY OF THE INVENTION

Accordingly, it is a primary object of the present invention to provide a tab tape bonding apparatus in which there is no need to replace parts or sprocket wheels even in cases where different types of tab tapes are used, and in which the precision with which the tab tape is positioned is improved.

The object is accomplished by a unique structure of the present invention which includes: (a) a bonding device which bonds semiconductor chips, etc. to a tab tape released from a supply reel, (b) a first roller driving means which feeds the tab tape to the bonding device, (c) a detection means which detects the holes (perforations) formed in the tab tape fed by the first roller driving means, and (d) a control device which controls the first roller driving means in accordance with the detection results obtained by the detection means.

If a magazine is used for the unloading section, a second roller driving means is installed between a cutter and the magazine.

With the device described above, a long tab tape which is wound on a supply reel is released and fed to the bonding position of the bonding device by the first roller driving means. When the tab tape is fed by this roller driving means, holes or perforations formed in the tab tape are detected by the detection means, in which the amount of the tab tape to be fed is set beforehand via a program in the control device. Accordingly, when the number of perforations detected or counted by the detection means reaches the fixed number, the feeding of the tab tape is stopped by the control device, setting the bonding position.

Then, semiconductor chips are bonded to the tab tape by the bonding device, and the tab tape is taken up on the take-up reel when the unloading section is a take-up reel. When a magazine is used as the unloading section, the tab tape is cut to fixed dimensions by the cutter, and the cut-out card-form tab tape pieces are transported by a second roller driving means and stored in the magazine.

Thus, since the tab tape is fed by the roller driving means, it is merely necessary to control the amount by which the tab tape is fed by the roller driving means even if the pitch and shape of the perforations in the tab tape should change. If the width of the tab tape is different, it is merely necessary to alter the space of or distance between the feed rollers of the roller driving means.

If the unloading section is a magazine, the circumferential speed of the second roller driving means is set so as to be higher than the circumferential speed of the first roller driving means. In this way, a part of the tab tape positioned in the area of the first roller driving means is pulled by a fixed tension. Thus, there is no meandering motion or jamming of the tab tape.

If the feed rollers of the roller driving means are connected to the driving sources of the feed rollers via one-way clutches, the tension on the tab tape is made uniform, so that the precision with which the tab tape is fed is improved.

DETAILED DESCRIPTION OF THE INVENTION

One embodiment of the present invention will be described with reference to the accompanying Figures.

Figure 1:
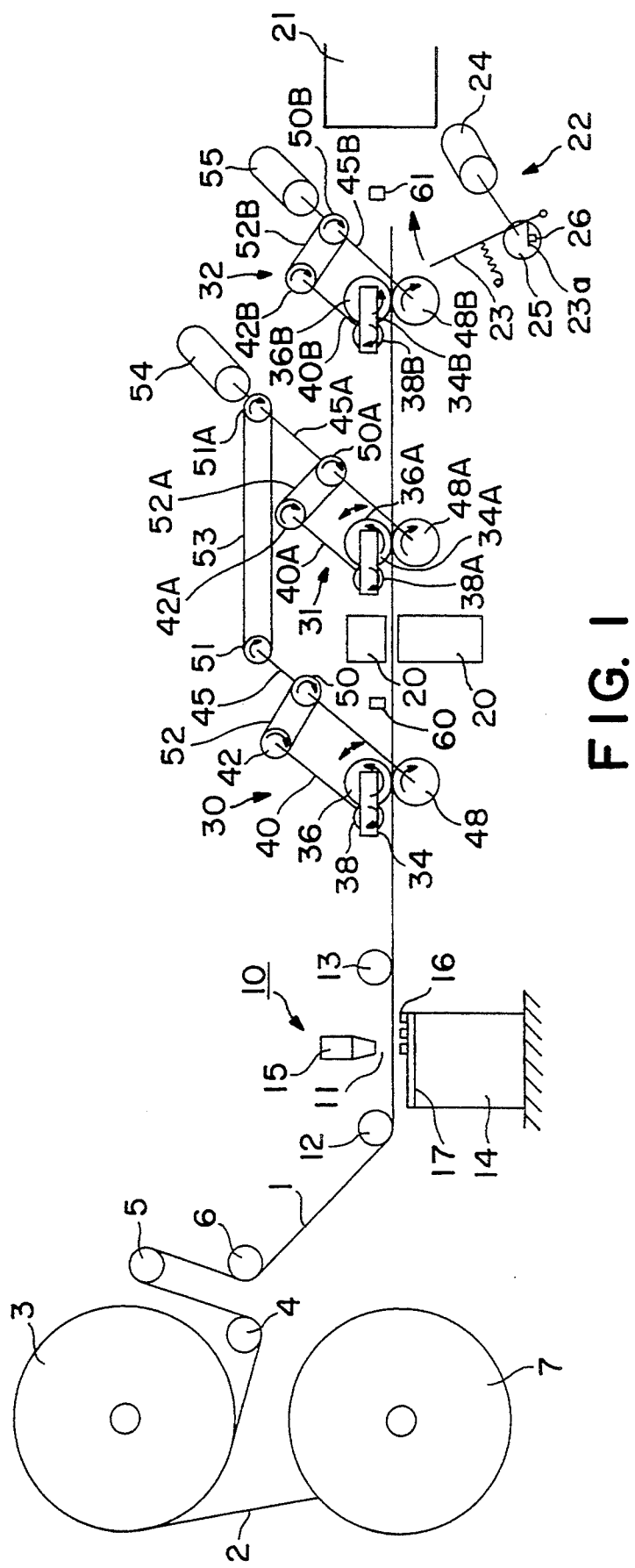
FIG. 1 is an explanatory diagram which schematically illustrates a tab tape bonding apparatus which uses one embodiment of the present invention.

As shown in FIG. 1, a tab tape 1 which is wound on a supply reel 3 along with protective tape 2 is fed to bonding area 11 of a bonding device 10 via a guide roller 4, tension roller 5 and guide roller 6. The protective tape 2 is separated and taken up on a protective tape reel 7.

Guide rollers 12 and 13 which guide the tab tape 1 are installed on both sides of the bonding area 11. The bonding device 10 includes an X-Y/vertical movement device 14, which is installed beneath the bonding area 11, and a bonding tool 15 which is installed above the bonding area 11..

The X-Y/vertical movement device 14 can move in the X and Y (or horizontal) directions and in the vertical direction. A chip-carrying table 17 to which semiconductor chips 16 are separately bonded is positioned on the upper surface of the X-Y/vertical movement device 14. With the vertical movement, the bonding tool 15 bonds the semiconductor chips 16 to the inner leads of the tab tape 1.

The tab tape 1 passes through the bonding area 11 and is led to a magazine 21 after passing linearly through a cutter 20.

A pushing device 22 is installed on the entry side of the magazine 21. This pushing device 22 has a pusher 23 which rotates freely. The pusher 23 extends in the direction in which the tab tape 1 is fed. The motor 24 of the pushing device 22 has a disk 25 mounted on the output shaft of the motor 24. A cam follower 26 is provided on the disk 25 and acts on an actuating lever 23a which extends horizontally from the pusher 23.

The above-described structure is substantially the same as that of a conventional apparatus; therefore, further description is omitted.

Roller driving means 30 is installed between the bonding device 10 and the cutter 20, and other roller driving means 31 and 32 are installed between the cutter 20 and the magazine 21. These roller driving means 30 through 32 all have the same structure; accordingly, only the roller driving means 30 will be described below. In cases where special reference is made to the roller driving means 31 or 32, the roller driving means 31 and 32 are distinguished by affixing "A" or "B" to the numbers of the same or corresponding parts, respectively.

Figure 2:
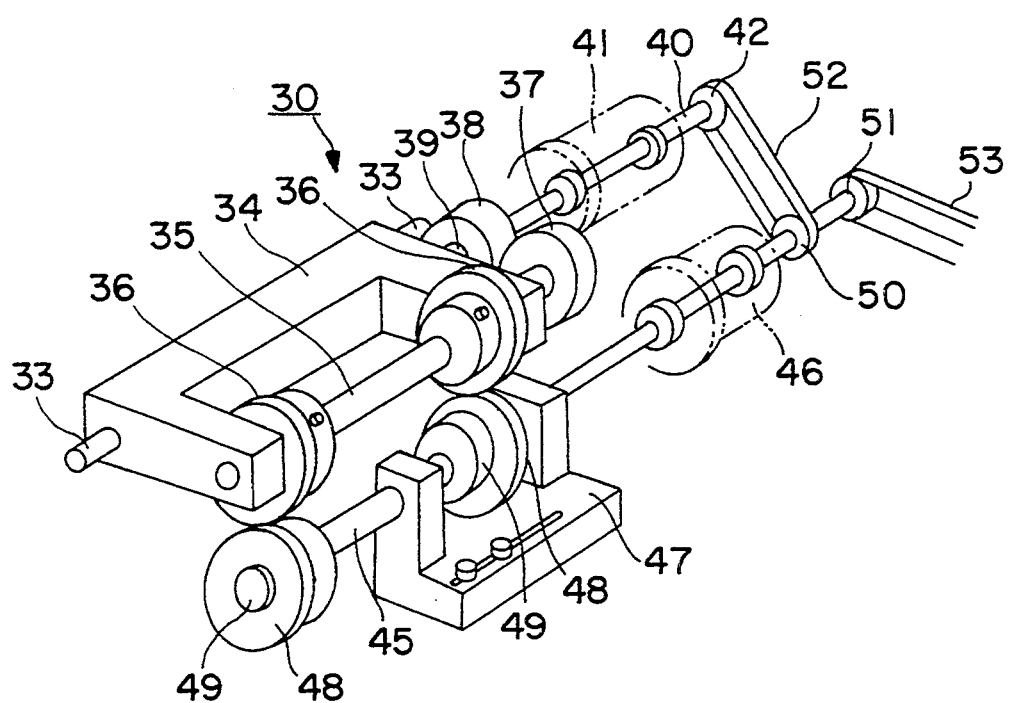
FIG. 2 is a perspective view of one of the roller driving means used in the apparatus shown in FIG. 1.

The detail of the roller driving means 30 is shown in FIG. 2.

Roller supporting block 34 shaped in a letter "U" is installed at a predetermined position of the apparatus so that the roller supporting block 34 lays above the tab tape 1 in a manner that the block 34 is pivotable about a shaft 33.

A roller shaft 35 is provided on the roller supporting block 34 so as to freely rotate. Two upper feed rollers 36 are installed inside the roller supporting block 34, and a gear 37 is installed outside the roller supporting block 34. Rollers 36 and gear 37 are mounted on the roller shaft 35.

A gear 38, which is coupled to one end of a drive shaft 40 via one-way clutch 39, engages with the gear 37. The drive shaft 40 is supported so that it is free to rotate on a fixed portion of the apparatus via a bearing 41. A pulley 42 is attached to the other end of the drive shaft 40.

A roller shaft 45 is installed beneath the roller shaft 35 so that the shaft 45 is parallel to the shaft 35. This roller shaft 45 is provided on a roller supporting plate 47 so that it is free to rotate at a fixed position of the apparatus.

Lower feed rollers 48 are attached to the roller shaft 45 via one-way clutches 49 and positioned so as to correspond to the upper feed rollers 36 and contact the undersurface of the tab tape 48. Pulleys 50 and 51 are mounted on the roller shaft 45, and a timing belt 52 is mounted on pulley 50 and the pulley 42.

As seen from FIG. 1, a timing belt 53 is mounted on the pulley 51 of the roller driving means 30 and pulley 51A of the roller driving means 31, and a motor 54 is connected to the roller shaft 45A of the roller driving means 31. In addition, a motor 55 is connected to the roller shaft 45B of the roller driving means 32.

The upper feed rollers 36A and lower feed rollers 48A have external diameters which are respectively smaller than those of the upper feed rollers 36 and lower feed rollers 48. In addition, the upper feed rollers 36B and lower feed rollers 48B are formed so that their external diameters are respectively smaller than those of the upper feed roller 36A and lower feed rollers 48A.

When the motors 54 and 55 run, the roller shafts 45A and 45B rotate clockwise so that the lower feed rollers 48A and 48B also rotate clockwise. Since the roller shaft 45 also rotates in a clockwise direction (through the pulley 51A, timing belt 53 and pulley 51), the lower feed rollers 48 rotate counterclockwise.

When the roller shafts 45, 45A and 45B rotate clockwise as described above, the drive shafts 40, 40A and 40B and gears 38, 38A and 38B rotate clockwise through the pulleys 42, 42A and 42B. As a result, the upper feed rollers 36, 36A and 36B rotate counterclockwise via the gears 37, 37A and 37B and roller shafts 35, 35A and 35B.

When the gears 38, 38A and 38B rotate clockwise as described above, the roller supporting blocks 34, 34A and 34B pivot in a clockwise direction. As a result, the upper feed rollers 36, 36A and 36B rotate counterclockwise while pressing the tab tape 1 against the lower feed rollers 48, 48A and 48B. Accordingly, the tab tape 1 is fed by being clamped by the upper feed rollers 36 and lower feed rollers 48, upper feed rollers 36A and feed rollers 48A, and upper feed rollers 36B and lower feed rollers 48B.

A detecting sensor 60 which detects the perforations of the tab tape 1 is installed between the roller driving means 30 and the cutter 20. Another detecting sensor 61 which detects the passage (end) of the tab tape 1 is installed in front of the magazine 21.

Figure 3:
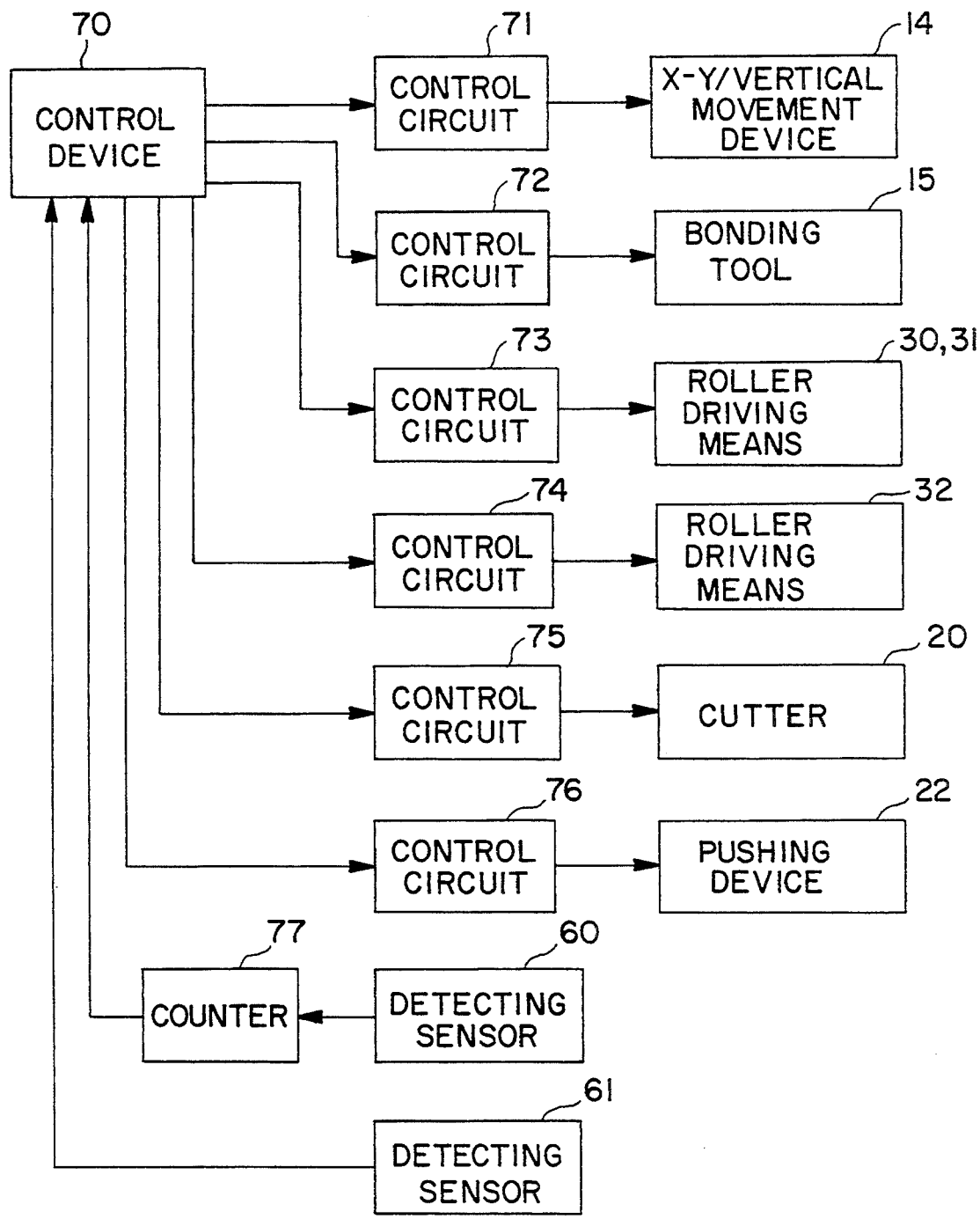
FIG. 3 is a block diagram of the control circuits.

As shown in FIG. 3, the X-Y/vertical movement device 14, the bonding tool 15, the roller driving means 30 through 32, the cutter 20 and the pusher means 22 are respectively controlled by a control device 70 via control circuits 71 through 76.

The amount by which the tab tape 1 is fed is set in advance in a program of the control device 70. The detecting sensor 60 detects the perforations of the tab tape 1. The number of the perforations are counted by a counter 77, and when the number of perforations counted reaches a set number, the roller driving means 30 and 31 are stopped by a command from the control device 70.

When the bonding of a preset number of semiconductor chips 16 to the tab tape 1 has been completed, the cutter 20 is actuated by a command from the control device 70.

The pusher means 22 is actuated by a command from the control unit 70 in accordance with a signal from the detecting sensor 61.

In operation, the tab tape 1 on the supply reel 3 is fed at a fixed pitch by an intermittent drive of the roller driving means 30. The perforations of the tab tape 1 are detected by the detecting sensor 60, and when the number of perforations counted by the counter 77 reaches the set number, the motor 54 is stopped. As a result, the bonding positions of the tab tape 1 is determined.

When the inner lead portions of the tab tape 1 supplied from the supply reel 3 are positioned in the bonding area 11, the X-Y/vertical movement device 14 is raised, and the bonding tool 15 is lowered, so that a semiconductor chip 16 is bonded to the inner leads of the tab tape 1.

Following this bonding, the X-Y/vertical movement device 14 is lowered and is then moved in the X and Y directions so that the next semiconductor chip 16 that is to be bonded is positioned in the bonding positioned. At the same time, the bonding tool 15 is raised. The operation described above is repeated so that semiconductor chips 16 are successively bonded to the inner leads of the tab tape 1.

When the bonding as described above is completed, the tab tape 1 is successively fed to the cutter 20 and roller driving means 31 and 32 by the roller driving means 30 via a linear tape guide. Then, after the bonding of a preset number of semiconductor chips 16 to the tab tape 1, the cutter 20 is actuated by the control device 70 via the control circuit 75, so that the tab tape 1 is cut into card-form pieces.

When the detecting sensor 61 detects the passing of the tab tape 1 which has been cut into card-form pieces, the pusher means 22 is actuated. As a result, the rear end of each piece of the tab tape 1 is pushed and the pieces of the tab tape 1 are pushed into the magazine 21.

In the embodiment described above, the magazine 21 is used as an unloading section. However, the present invention can also be applied to an apparatus which uses a take-up reel.

In this case, the cutter 21, pusher means 22 or roller driving means 31 and 32, etc are not necessary.

In the embodiment described above, the detecting sensor 60 is installed in the downstream side of the roller driving means 30; however, it would be possible to install the sensor 60 in front of (or the upstream side of) the roller driving means 30. Also, the detecting sensor 60 detects the perforations of the tab tape 1; however, it would be possible to form detection holes in the tab tape 1 so that the sensor 60 detects these detection holes.

The embodiments above are described with reference to bonding of semiconductor chips 16 to the tab tape 1; however, it would be possible to apply the present invention to bonding of single bumps.

As described above in detail, since the tab tape 1 is fed by the roller driving means 30 through 32, it is only necessary to control the amount of the tab tape 1 fed by the roller means 30 through 32, even though pitches and shapes of the perforations in the tab tape 1 are changed or different.

If the width of the tab tape 1 is changed, it is only necessary to change the space or distance between the feed rollers 36 and 36 and the spacing between the feed rollers 48 and 48 (to take the case of the roller driving means 30 as an example).

In case the unloading section is the magazine 21, the circumferential speeds of the second roller driving means 31 and 32 are set so that they are higher than the circumferential speed of the first roller driving means 30; as a result, a part of the tab tape 1 positioned in the area of the cutter 20 is pulled by a fixed tension, so that there is no meandering motion or jamming of the tab tape occurring.

Since the feed rollers 36 and 48 of the roller driving means 30 are connected to the drive shafts 40 and 45 of the feed rollers 36 and 48 via one-way clutches 39 and 49, the tension applied to the tab tape 1 can be uniform. Thus, the precision with which the tab tape 1 is fed can be improved. This is also true for the other roller driving means 31 and 32.

Furthermore, in the present invention, a tab tape is fed by roller driving means, and the amount by which the tab tape is fed is controlled by a control device. Accordingly, there is no need to change parts for different types of tab tapes so that the precision with which the tab tape is positioned is improved.

We claim:

1. A tab tape bonding apparatus for bonding semiconductor chips to a perforated tab tape with inner leads provided thereon comprising:
    a bonding device which bonds semiconductor chips to inner leads on a perforated tab tape which is supplied from a supply reel;
    a first roller driving means which feeds said perforated tab tape with said semiconductor chips bonded thereto from said bonding device;
    a detection means which detects a number of perforations formed in said perforated tab tape fed by said first roller driving means; and
    a control device which controls said first roller driving means in accordance with the detection results obtained by said detection means.

2. A tab tape bonding apparatus for bonding semiconductor chips to a perforated tab tape with inner leads provided thereon comprising:
    a bonding device which bonds semiconductor chips to inner leads on a perforated tab tape which is supplied from a supply reel;
    a cutter device which cuts said perforated tab tape bonded by said bonding device into fixed dimensions thereby making card-form tab tape pieces with semiconductor chips bonded thereto;
    a magazine device which drives a magazine upward and downward for loading into said magazine said card-form tab tape pieces with semiconductor chips bonded thereto cut by said cutter device;
    a first roller driving means which is installed between said bonding device and said cutter device for feeding said tab tap with semiconductor chips bonded thereto from said bonding device;
    a second roller driving means which is installed between said cutter device and said magazine for feeding said card-form tab tape pieces to said magazine from said cutter device;
    a detection means which detects a number of perforations formed in said perforated tab tape fed by said first roller driving means; and a control device which controls said first roller driving means in accordance with the detection results obtained by said detection means.

3. A tab tape bonding apparatus according to claim 2, wherein circumferential speed of feed rollers driven by said second roller driving means is higher than that of feed rollers driven by said first roller driving means.

4. A tab tape bonding apparatus according to claim 3, wherein said second roller driving means comprises a plurality of roller driving means, and circumferential speed of feed rollers driven by roller driving means on said cutter device side is higher than that of feed rollers driven by said first roller driving means.

5. A tab tape bonding apparatus according to claim 1, wherein feed rollers driven by said first roller driving means are connected to a driving source of said feed rollers via one-way clutches.

6. A tab tape bonding apparatus according to claim 2, 3 or 4, wherein feed rollers driven by said first and second roller driving means are connected to driving sources of said feed rollers via one-way clutches.

7. A tab tape bonding apparatus according to claim 1 wherein said detection means is provided between said bonding device and said first roller driving means.

8. A tab tape bonding apparatus according to claim 2, wherein said detection means is provided between said bonding device and said first roller driving means.

9. A tab tape bonding apparatus according to claim 8, further comprising a pusher means for pushing said card-form tab tape pieces into said magazine device.

10. A tab tape bonding apparatus for bonding semiconductor chips to a perforated tab tape with inner leads provided thereon comprising:
- a bonding device which bonds semiconductor chips to inner leads on a perforated tab tape which is supplied from a supply reel;
- a first roller driving means which feeds said perforated tab tape with said semiconductor chips bonded thereto from said bonding device, said first roller driving means comprising:
- a first shaft provided above said tab tape;
- a U-shaped roller support block pivotally provided on said shaft;
- a second shaft extending between and rotatably coupled to arms of said U-shaped roller support block;
- a first pair of rollers provided on said second shaft, each of said pair of rollers being provided adjacent one of said arms of said U-shaped roller support block;
- a roller support plate provided below said tab tape;
- a third shaft rotatably coupled to said roller support plate;
- a second pair of rollers provided on said third shaft and opposing said first pair of rollers;
- a motor for rotatably driving both said second and third shafts;
- a detection means which detects a number of perforations formed in said perforated tab tape fed by said first roller driving means; and
- a control device which controls said first roller driving means in accordance with the detection results obtained by said detection means.

* * * * *